(12) United States Patent
Morikawa

(10) Patent No.: US 6,651,231 B2
(45) Date of Patent: Nov. 18, 2003

(54) CLOCK SYNCHRONIZING CIRCUIT AND METHOD OF DESIGNING THE SAME

(75) Inventor: Shun Morikawa, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 123 days.

(21) Appl. No.: 09/938,482

(22) Filed: Aug. 27, 2001

(65) Prior Publication Data

US 2002/0157065 A1 Oct. 24, 2002

(30) Foreign Application Priority Data

Apr. 23, 2001 (JP) .......................... 2001-124614

(51) Int. Cl.[7] .............................................. G06F 17/50
(52) U.S. Cl. ....................... 716/6; 716/4; 716/5; 716/8
(58) Field of Search ................................ 716/4, 5, 6, 8

(56) References Cited

U.S. PATENT DOCUMENTS 6,300,809 B1 * 10/2001 Gregor et al. ............... 327/200
6,405,355 B1 * 6/2002 Duggirala et al. ............. 716/8

FOREIGN PATENT DOCUMENTS

JP     2000-11663 A     1/2000

* cited by examiner

Primary Examiner—Leigh M. Garbowski
Assistant Examiner—Brandon Bowers
(74) Attorney, Agent, or Firm—Leydig, Voit & Mayer, Ltd.

(57) ABSTRACT

A clock synchronizing circuit includes many sequential circuits which operate on the basis of the same clock signal. The sequential circuits sample input data and change output data at both rising and falling edges of the clock signal. The sequential circuits include an input selector circuit which selects either of two inputs in accordance with a test mode signal. The output of one sequential circuit is input into an input selector circuit of a subsequent sequential circuit. Thus, a scan pass is formed.

4 Claims, 7 Drawing Sheets

US 6,651,231 B2

CLOCK SYNCHRONIZING CIRCUIT AND METHOD OF DESIGNING THE SAME

FIELD OF THE INVENTION

The present invention relates to a clock synchronizing circuit capable of obtaining a plurality of outputs in one clock signal, and to a method of designing the clock synchronizing circuit.

BACKGROUND OF THE INVENTION

Digital circuits integrated by LSI (large scale integration) are usually clock synchronizing type circuit structures in which a combinatorial logic circuit is divided at sequential circuits, such as flip-flop circuits or latch circuits or the like. The structure of a conventional clock synchronizing circuit is shown in FIG. 9. Reference numerals 101 through 106 respectively represent rising edge trigger flip-flop circuits, and reference numeral 107 represents an arbitrary combinatorial logic circuit. FIG. 10 is a timing chart showing operations of the clock synchronizing circuit. As shown in FIG. 10, at the rising edges (T0, T2) of the clock signal, the flip-flop circuit samples the value of the input data (for example, signal 109), and outputs the sampled value. Thus, the output of the flip-flop circuit can produce a single output data for one clock cycle.

In such a clock synchronizing circuit, the clock tree, which is formed by the buffer and the sequential circuits, accounts for a large amount of the electric power which is consumed. A gated clock method is a general method for reducing the amount of power consumed by the clock tree. In this method, the circuit is divided into a plurality of blocks, and the supply of the clock signal is temporarily stopped for circuit blocks which do not need to be operated.

However, in the gated clock method, clock signals must be supplied to circuit blocks which need to be operated, and thus, there are limits to reducing the amount of power which is consumed.

SUMMARY OF THE INVENTION

It is an object of the present invention is to provide a clock synchronizing circuit in which the amount of consumed power can always be reduced regardless of the operational state, and to a method of designing the clock synchronizing circuit.

The clock synchronizing circuit according to one aspect of the present invention comprises a plurality of sequential circuits which operate on the basis of a single clock signal. Each of the sequential circuits carries out sampling of input data and changing of output data at both a rising edge and a falling edge of the clock signal. Moreover, each of the sequential circuits includes an input selector unit which receives two inputs and selects any one of the two inputs in accordance with a predetermined control signal. An output of a desired one of the sequential circuit is input as one input of the input selector unit provided in another sequential circuit which is provided at a subsequent stage to the desired sequential circuit thereby forming a series of scan pass in sequential circuits.

The clock synchronizing circuit according to another aspect of the present invention comprises a plurality of sequential circuits which operate on the basis of a single clock signal. Each of the sequential circuits carries out sampling of input data and changing of output data at both a rising edge and a falling edge of the clock signal. Moreover, each of the sequential circuits includes an input selector unit which receives an input signal and an inverted signal of the input signal and selects and outputs any one of the input signal and the inverted signal in accordance with a predetermined control signal. An output of one sequential circuit is input into the input selector unit provided in the same sequential circuit, and the output of the one sequential circuit is input into a clock terminal of a sequential circuit provided at a subsequent stage to the desired sequential circuit.

According to still another aspect of the present invention, the clock synchronizing circuit of the invention can be generated by the logic synthesis method.

Other objects and features of this invention will become apparent from the following description with reference to the accompanying drawings.

DESCRIPTION OF THE PREFERRED EMBODIMENTS

Embodiments of the clock synchronizing circuit and the method for designing the clock synchronizing circuit of the present invention will be described hereinafter in detail with reference to the accompanying drawings.

Figure 1:
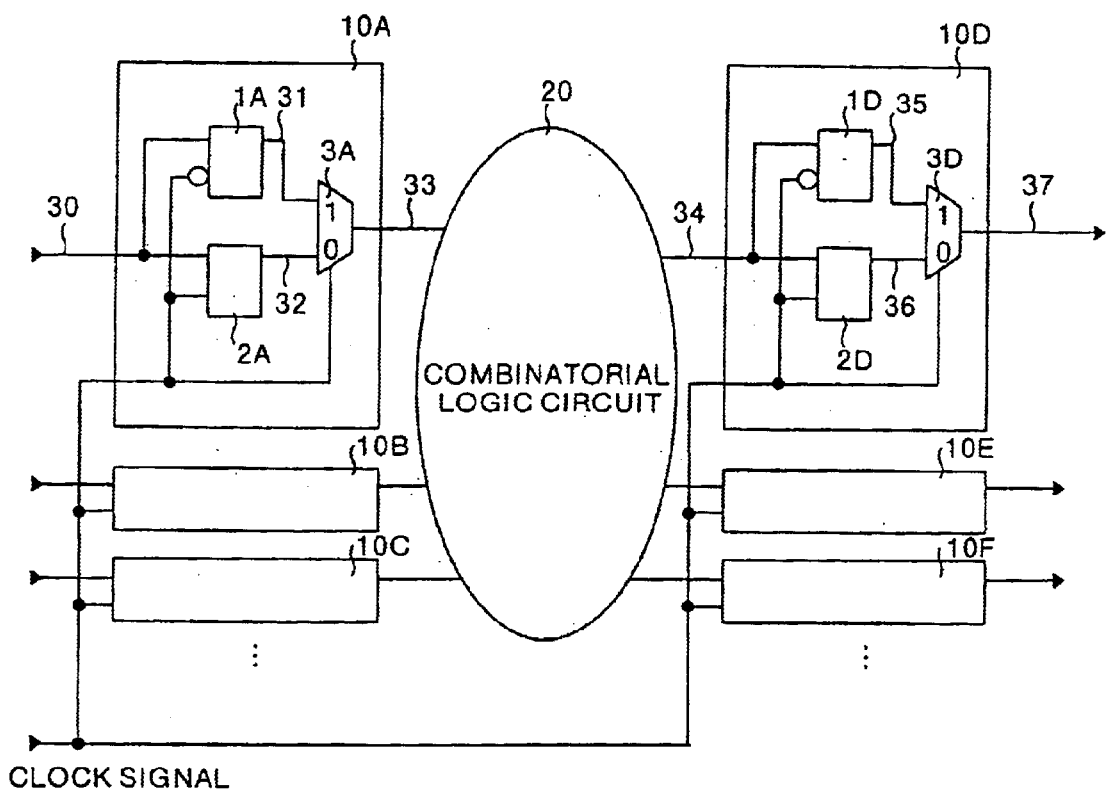
FIG. 1 is a structural diagram for explaining the principles of a clock synchronizing circuit of the present invention.

FIG. 1 is a structural diagram for explaining the principles of the clock synchronizing circuit of the present invention. Reference numerals 10A through 10F are circuits having the same structure, and each functions as a one-bit sequential circuit. At the sequential circuits 10A, 10D, reference numerals 1A, 1D are low level sensing latch circuits which, when clock signals are low logical level ("Low"), allow the data to pass through, and when clock signals are high logical level ("High"), hold the data. Reference numerals 2A, 2D are high level sensing latch circuits which, when clock signals are "High", allow the data to pass through, and when clock signals are "Low", hold the data. Reference numerals 3A, 3D are output selector circuits which, when clock signals are "High", select the outputs of the low level sensing latch circuits 1A, 1D, and when clock signals are "Low", select and output the outputs of the high level sensing latch circuits 2A, 2D.

If the clock signal is "High", at the sequential circuit 10A, the output of the latch circuit 1A is selected by the output selector circuit 3A. The outputs of other sequential circuits (the sequential circuits 10B, 10C, and the like) which are inputted to a combinatorial logic circuit 20 operate in the same way. The output of the combinatorial logic circuit 20 is fetched by the latch circuit 2D at the sequential circuit 10D.

On the other hand, when the clock signal is "Low", at the sequential circuit 10A, the output of the latch circuit 2A is selected by the output selector circuit 3A. The outputs of the other sequential circuits (the sequential circuits 10B, 10C, and the like) which are inputted to the combinatorial logic circuit 20 operate in the same way. The output of the combinatorial logic circuit 20 is fetched by the latch circuit 1D at the sequential circuit 10D.

Figure 2:
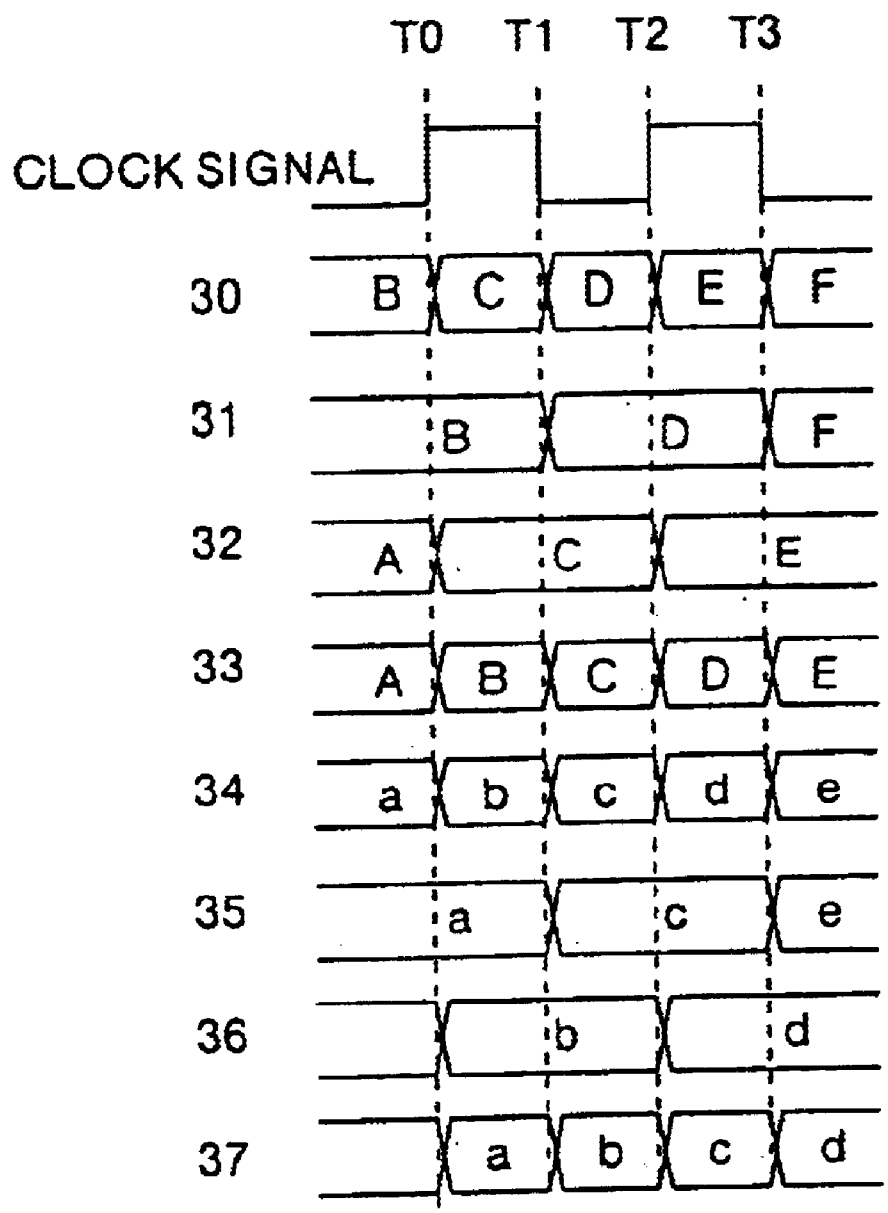
FIG. 2 is a time chart showing operations of the clock synchronizing circuit which is shown in FIG. 1.

The operation timings which are described above are shown in FIG. 2. Reference numeral 33, which is the output of the sequential circuit 10A, changes at each half period T0, T1, T2, T3 of the clock signal. Further, at the sequential circuit 10D, when the clock signal is "Low", fetching of the data is carried out by the low level sensing latch circuit 1D, and when the clock signals are "High", fetching of the data is carried out by the high level sensing latch circuit 2D. Namely, the sequential circuit 10D samples an output signal 34 of the combinatorial logic circuit 20 at each half period of the clock signal.

In accordance with the clock synchronizing circuit shown in FIG. 1, two data outputs can be obtained per clock period. Accordingly, as compared with a conventional circuit structure in which one data output is obtained per clock period, the clock frequency can be made to be ½, and electric power consumption can always be greatly reduced regardless of the operating state.

Figure 3:
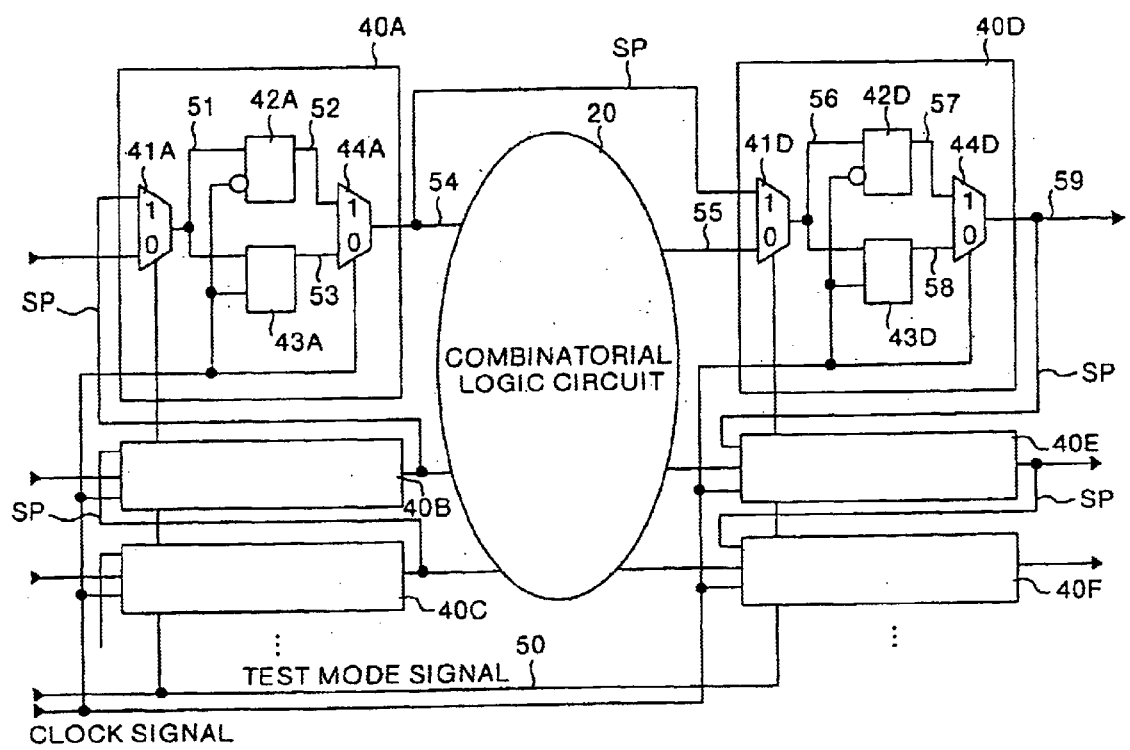
FIG. 3 is a structural diagram showing a clock synchronizing circuit of an LSI which is a first embodiment of the present invention.

FIG. 3 is a structural diagram showing a clock synchronizing circuit of an LSI which is the first embodiment of the present invention. Reference numerals 40A through 40F are circuits having the same structure, and each functions as a one-bit sequential circuit. Each sequential circuit 40A through 40F has two data inputs. One of the data inputs is a usual data input, and the other data input is a data input for testing. The output of each sequential circuit 40A through 40F is successively connected to the data input for testing of the sequential circuit at the subsequent stage, such that a series of scan passes SP is formed.

At the sequential circuits 40A, 40D, reference numerals 41A, 41D are input selector circuits. When a test mode signal 50 is "High", the input selector circuits 41A, 41D select the data input for testing (the upper input of the two inputs in FIG. 3). When the test mode signal 50 is "Low", the input selector circuits 41A, 41D select and output the usual data input (the lower input of the two inputs in FIG. 3). Reference numerals 42A, 42D are low level sensing latch circuits which, when clock signals are "Low", allow the data to pass through, and when clock signals are "High", hold the data. Reference numerals 43A, 43D are high level sensing latch circuits which, when clock signals are "High", allow the data to pass through, and when clock signals are "Low", hold the data. Reference numerals 44A, 44D are output selector circuits which, when clock signals are "High", select the outputs of the low level sensing latch circuits 42A, 42D, and when clock signals are "Low", select and output the outputs of the high level sensing latch circuits 43A, 43D.

At the clock synchronizing circuit which is structured as described above, when the test mode signal 50 is "Low", the same operations as those of the clock synchronizing circuit shown in FIG. 1 are carried out. Namely, at the clock synchronizing circuit which is shown in FIG. 3, two data outputs can be obtained per clock period. Therefore, as compared to a conventional circuit structure in which one data output is obtained per clock period, the clock frequency can be made to be ½, and regardless of the operational state, a large reduction in electric power consumption is always possible.

Figure 4:
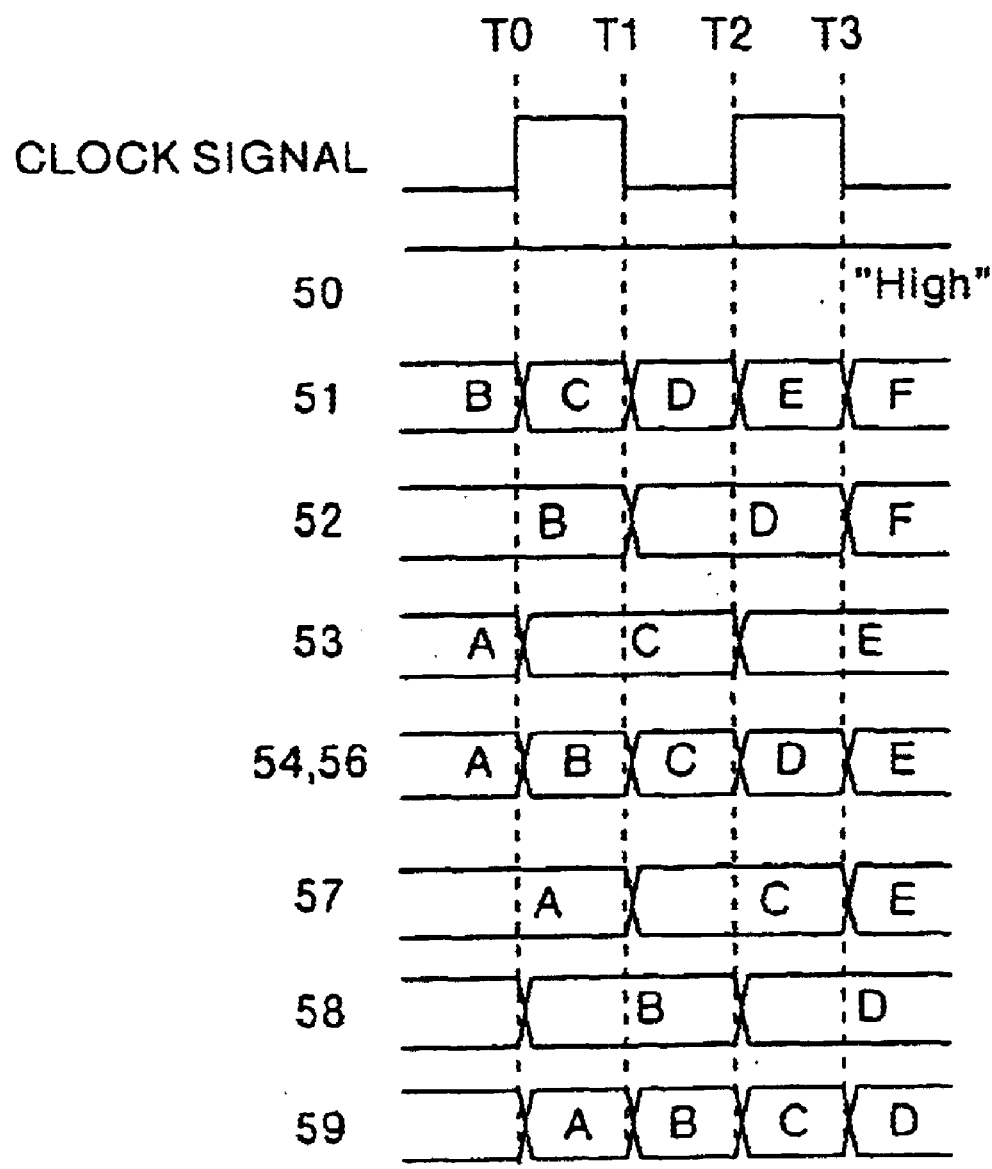
FIG. 4 is a time chart showing operations of the clock synchronizing circuit which is shown in FIG. 3.

On the other hand, when the test mode signal 50 is "High", each sequential circuit 40A through 40F can carry out a shifting operation of the data. The operation timings at this time are shown in FIG. 4. At the clock synchronizing circuit of FIG. 3, the sequential circuit 40A is connected to the sequential circuit 40D by the scan pass SP. Therefore, at each half period T0, T1, T2, T3 of the clock signal, the value of reference numeral 54, which is an output of the sequential circuit 40A, is shifted to reference numeral 59 which is an output of the sequential circuit 40D. By this shifting operation, test methods such as full scanning or boundary scanning can be applied, and testing and debugging of the clock synchronizing circuit can be carried out rapidly and easily.

Figure 5:
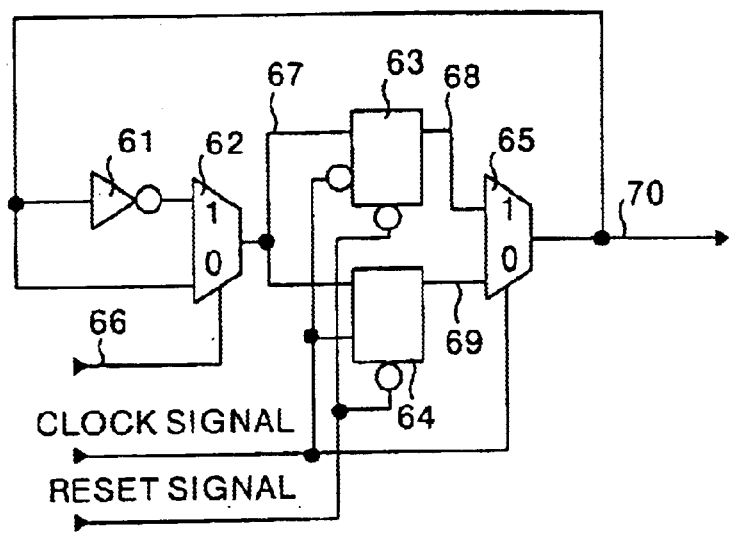
FIG. 5 is a structural diagram of main portions, showing a clock synchronizing circuit of an LSI which is a second embodiment of the present invention.
Figure 6:
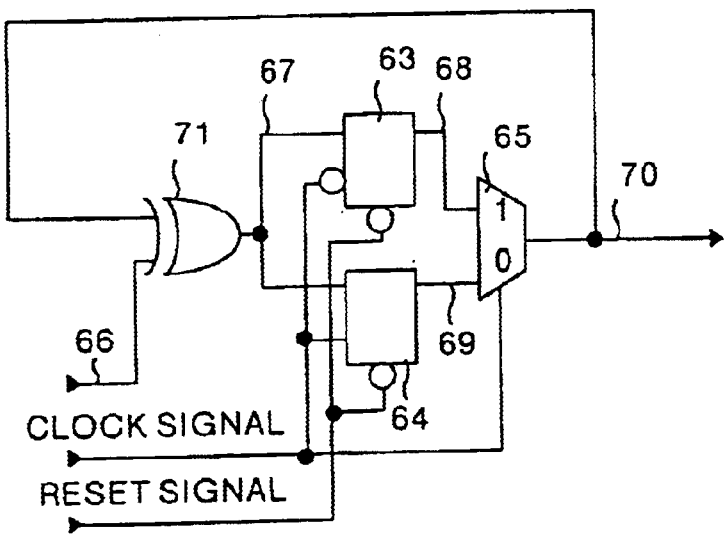
FIG. 6 is a structural diagram of main portions, showing a modified example of the clock synchronizing circuit which is shown in FIG. 5.

FIG. 5 is a structural diagram of main portions, and shows a clock synchronizing circuit of an LSI which is the second embodiment. Reference numeral 66 is a clock enable signal which is for operating/stopping the clock signal, and reference numeral 70 is an output of the clock synchronizing circuit. Reference numeral 61 is an inverter, numeral 62 is an input selector circuit, numeral 65 is an output selector circuit, numeral 63 is a low level sensing latch circuit, and numeral 64 is a high level sensing latch circuit. Among the structures which are described above, the circuit which is formed by the inverter 61 and the input selector circuit 62 can be replaced with an exclusive OR circuit whose inputs are the output 70 and the clock enable signal 66. This structure is shown in FIG. 6. In FIG. 6, reference numeral 71 is an exclusive OR circuit corresponding to the circuit which is formed from the inverter 61 and the input selector circuit 62.

Figure 7:
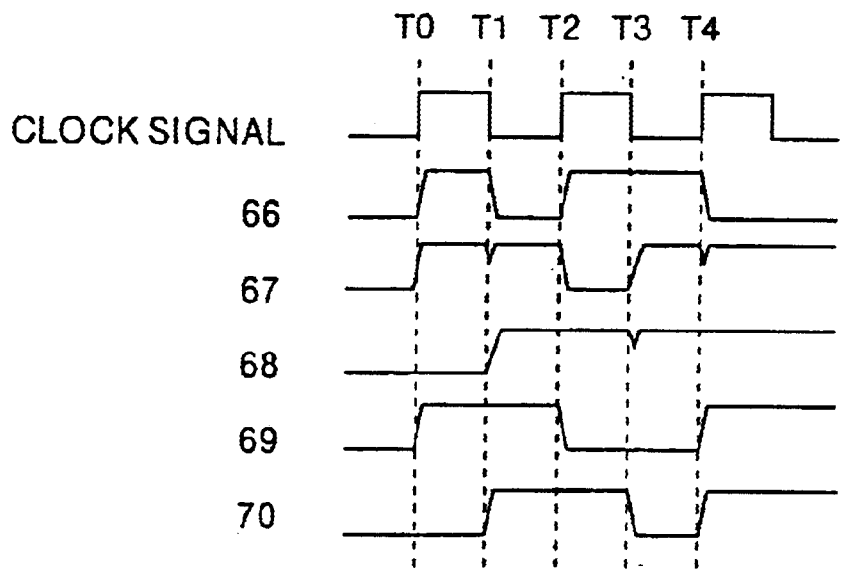
FIG. 7 is a time chart showing operations of the clock synchronizing circuit which is shown in FIG. 5.

The operation timings of the clock synchronizing circuit of FIG. 5 are shown in FIG. 7. When the clock enable signal 66 is "Low", the input selector circuit 62 selects the output 70, and when the clock enable signal 66 is "High", the input selector circuit 62 selects the inverted signal of the output 70. A signal 67 which is an output of the input selector circuit 62 is taken into a sequential circuit which is formed from the pair of latch circuits 63, 64 and the output selector circuit 65, and is outputted as the output 70, in the same way as in the clock synchronizing circuit which is shown in FIG. 1.

The clock synchronizing circuit of FIG. 5 has the feature that, when the clock enable signal 66 is "High", the value of the output 70 is inverted, and when the clock enable signal 66 is "Low", the value of the output 70 does not change. This output can be utilized as the gated clock output 70, and by supplying the gated clock output 70 as the clock signal of the clock synchronizing circuit of the first embodiment and appropriately controlling the clock enable signal 66, a gated clock method can be realized. As a result, in accordance with a clock synchronizing circuit in which the clock synchronizing circuit of the present second embodiment is applied as a clock generating circuit, due to the synergistic effect resulting from making the clock frequency ½ and using the gated clock method, it is possible to reduce electric power consumption even more. Furthermore, the output of the sequential circuit 40A is input into a clock terminal of the sequential circuit 40D provided at a subsequent stage to the sequential circuit 40A.

As a third embodiment of the present invention, a method of designing a circuit including the clock synchronizing circuit which is shown in FIG. 1 will be described.

Figure 8:
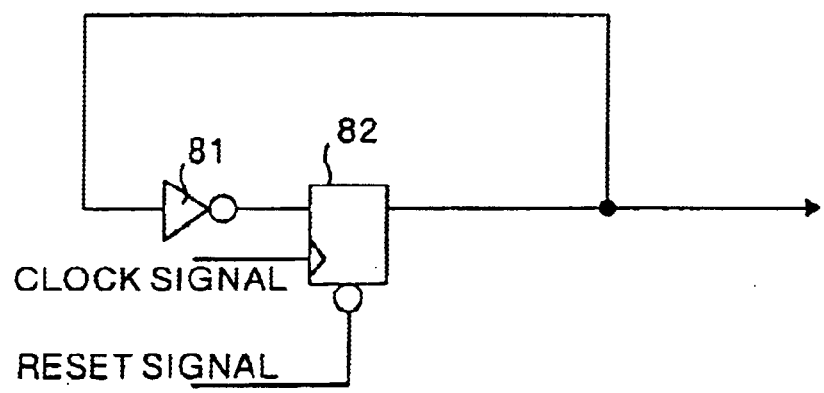
FIG. 8 is a structural diagram showing a divide-by-two frequency dividing circuit cell which is used in a method of designing a clock synchronizing circuit which is a third embodiment of the present invention.
Figure 9:
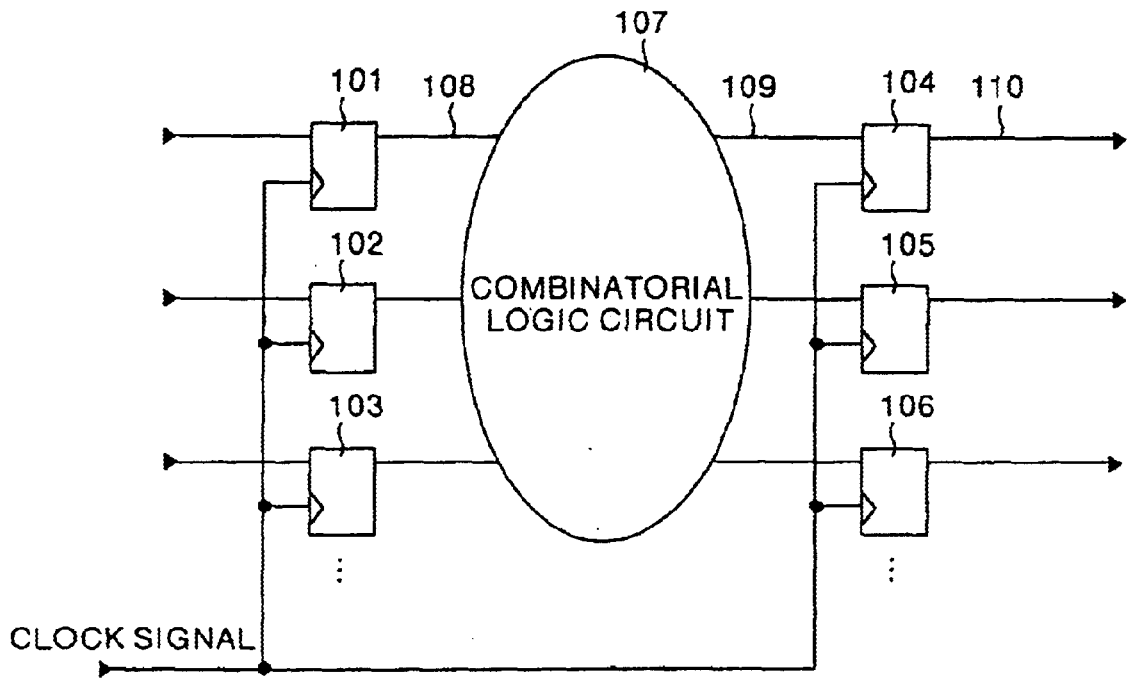
FIG. 9 is a structural diagram of a general clock synchronizing circuit.
Figure 10:
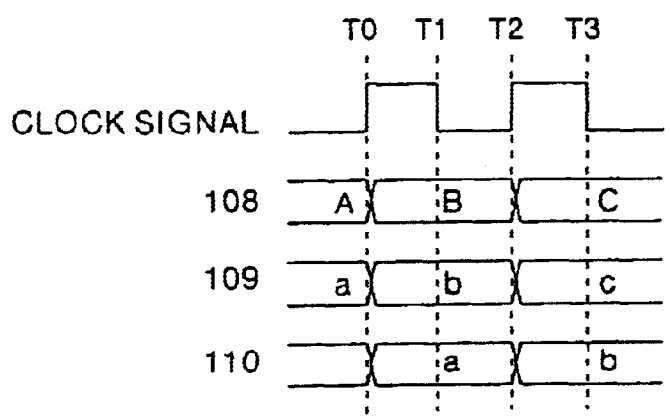
FIG. 10 is a time chart showing operations of the clock synchronizing circuit which is shown in FIG. 9.

In order to use the logic synthesis method, a library for logic synthesis, in which basic cells such as flip-flop circuits, inverters and the like are collected, is prepared. In addition to conventional basic cells, the sequential circuit 10A which is shown in FIG. 1 and a divide-by-two frequency dividing circuit cell 80 shown in FIG. 8 are added to the library for logic synthesis. At this time, the sequential circuit 10A is registered in the library for logic synthesis as a flip-flop circuit. The conventional flip-flop circuit is removed from the library for logic synthesis, or is set so as to not be used at the time of logic synthesis. A source file which is for designing a clock synchronizing circuit which uses a conventional flip-flop circuit is used as an HDL (Hardware Description Language) source file which is the source of the logic synthesis. However, at the supply source of the clock signals, the divide-by-two frequency dividing circuit cell 80 of FIG. 8 is disposed.

In this way, the library for logic synthesis and the HDL source file are prepared, and there after, logic synthesis is carried out. In the logic synthesis, because the sequential circuit 1A is registered in the library for logic synthesis as a flip-flop circuit, the portion which is converted to the cell of the flip-flop circuit which is described in the HDL source file is converted into the sequential circuit 10A, and a circuit including the clock synchronizing circuit which is shown in FIG. 1 can be generated. Here, because the logic circuit which should have been converted into a flip-flop circuit is converted into the sequential circuit 10A, the data output rates for the clock signals of the circuit which is generated after logic synthesis and the circuit which is described in the HDL source file are different from each other. Therefore, before the logic synthesis, the divide-by-two frequency dividing circuit cell 80 of FIG. 8 is made to be a circuit which does not divide the frequency. Or, the divide-by-two frequency dividing circuit cell 80 is removed and simulation is carried out, and after the logic synthesis, if the divide-by-two frequency dividing circuit cell 80 of FIG. 8 is simulated as a circuit which divides frequency, the operation at the time of the simulation is the same before and after the logic synthesis.

As described above, in accordance with the third embodiment of the present invention, due to the sequential circuit 10A being registered in the library for logic synthesis as a flip-flop circuit, a circuit including the clock synchronizing circuit which is shown in FIG. 1 can be easily generated by using a usual logic synthesis method.

As the fourth embodiment of the present invention, another method of designing a circuit including the clock synchronizing circuit which is shown in FIG. 1 or FIG. 3 will be described.

In the same way as in the third embodiment, the sequential circuit 10A which is shown in FIG. 1, or the sequential circuit 40A which is shown in FIG. 3, and the divide-by-two frequency dividing circuit cell 80 which is shown in FIG. 8 are added to the library for logic synthesis which is used at the time of using the logic synthesis method. However, in the fourth embodiment, the conventional flip-flop circuit is left in the library for logic synthesis. A source file which is for designing a clock synchronizing circuit which uses a conventional flip-flop circuit is used as the HDL source file which is the source of the logic synthesis.

In this way, the library for logic synthesis and the HDL source file are prepared, and thereafter, logic synthesis is carried out. In the logic synthesis, the sequential circuit 10A of FIG. 1, the sequential circuit 40A of FIG. 3, and the divide-by-two frequency dividing circuit cell 80 of FIG. 8 are removed from the cell which is used in the logic synthesis, and in the same way as conventionally, the clock synchronizing circuit by the flip-flop circuit is generated. After the logic synthesis is finished, the flip-flop circuit is replaced with the desired sequential circuit 10A, 40A. Namely, if a testing method such as full scanning or boundary scanning is applied, the flip-flop circuit is replaced by the sequential circuit 40A. In a case in which these testing methods are not used, the flip-flop circuit is replaced by the sequential circuit 1A. At this time, the divide-by-two frequency dividing circuit cell 80 of FIG. 8 is inserted into the supply source of the clock signal. This is to prevent the circuit operation from changing at the time of simulation before and after the replacement of the flip-flop circuit with the sequential circuit 10A, 40A.

As described above, in accordance with the fourth embodiment of the present invention, a clock synchronizing circuit by a flip-flop circuit is generated by logic synthesis. Thereafter, due to the flip-flop circuit being replaced with the sequential circuit 10A, 40A, a circuit including the clock synchronizing circuit which is shown in FIG. 1 or FIG. 3 can be easily generated by using a usual logic synthesis method.

As described above, in accordance with one aspect of the present invention, because two data outputs can be obtained per clock period, electric power consumption can always be reduced regardless of the operational state. Further, because full scanning or boundary scanning can be carried out by using a scan pass, testing or debugging of the clock synchronizing circuit can be carried out quickly and easily.

In accordance with another aspect of the present invention, because two data outputs can be obtained per clock period, electric power consumption can always be reduced regardless of the operational state. Further, by controlling the control signal, the presence/absence of the supply of a clock signal to the second sequential circuit can be controlled. Therefore, by using the gated clock method, the electric power consumption can be decreased even more.

Furthermore, by providing a pair of latch unit and an output selector unit, input data sampling and output data changing at both a rising edge and a falling edge of a clock signal can be carried out. Thus, the clock synchronizing circuit of the present invention can be easily realized.

In accordance with still another aspect of the present invention, the clock synchronizing circuit of the invention can easily be generated by using the logic synthesis method.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A clock synchronizing circuit comprising a plurality of sequential circuits which operate based on a single clock signal, each of said sequential circuits sampling input data and changing output data at both a rising edge and a falling edge of the clock signal, each of said sequential circuits including;

an input selector unit which receives two inputs and selects one of the two inputs in accordance with a control signal as an output, wherein an output of a selected one of said sequential circuits is input as one input of a sequential input selector unit in a sequential circuit at a subsequent stage, thereby forming a scan pass in said sequential circuits;

a pair of latch units latching data alternately in accordance with the clock signal, both latch units receiving as an input the output of said input selector unit; and an output selector unit which selects and outputs an output of said latch units in accordance with the clock signal.

2. A clock synchronizing circuit comprising a plurality of sequential circuits which operate based on a single clock signal, each of said sequential circuits sampling input data and changing output data at both a rising edge and a falling edge of the clock signal, each of said sequential circuits including:

an input selector unit which receives an input signal and an inverted signal of the input signal and selects and outputs one of the input signal and the inverted signal in accordance with a control signal, wherein an output of one of said sequential circuits is input to said input selector unit of said sequential circuit, and the output of said sequential circuit is input to a clock terminal of a sequential circuit in a subsequent stage;

a pair of latch units initializing data by activating a reset signal and latching data alternately in accordance with the clock signal, both latch units receiving as an input the output of said input selector unit; and an output selector unit which selects and outputs an output of said latch units in accordance with the clock signal.

3. A method of designing a clock synchronizing circuit, the method comprising:

registering, in a library for logic synthesis, a sequential circuit with a pair of latch units connected in parallel to a single input selector unit and latching data alternately in accordance with a clock signal, and an output selector unit selecting and outputting an output of said pair of latch units in accordance with the clock signal, said sequential circuit supplying input data and changing output data at both a rising edge and a falling edge of the clock signal; and generating a clock synchronizing circuit including said sequential circuit, by logic synthesis using said sequential circuit as a flip-flop circuit.

4. A method of designing a clock synchronizing circuit, the method comprising:

registering, in a library for logic synthesis, a sequential circuit with a pair of latch units connected in parallel to a single input selector unit and latching data alternately in accordance with a clock signal, and an output selector unit selecting and outputting an output of said pair of latch units in accordance with the clock signal, said sequential circuit supplying input data and changing output data at both a rising edge and a falling edge of the clock signal; and generating a clock synchronizing circuit including said sequential circuit, by after circuits including a flip-flop circuit are generated by logic synthesis, replacing an arbitrary flip-flop circuit with the sequential circuit.

* * * * *